(12) United States Patent
Szeto et al.

(10) Patent No.: US 10,283,192 B2
(45) Date of Patent: May 7, 2019

(54) RETENTION VOLTAGE GENERATION CIRCUIT AND ELECTRONIC APPARATUS

(71) Applicants: Semiconductor Manufacturing International (Shanghai) Corporation, Shanghai (CN); Semiconductor Manufacturing International (Beijing) Corporation, Beijing (CN)

(72) Inventors: Simon To-Ming Szeto, Shanghai (CN); Lei Wu, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/809,387

(22) Filed: Nov. 10, 2017

(65) Prior Publication Data

US 2018/0137911 A1    May 17, 2018

(30) Foreign Application Priority Data

Nov. 11, 2016   (CN) .......................... 2016 1 0994781

(51) Int. Cl.
*G11C 11/412*   (2006.01)
*G11C 11/417*   (2006.01)
(Continued)

(52) U.S. Cl.
CPC ............ *G11C 11/4125* (2013.01); *G05F 3/24* (2013.01); *G11C 5/14* (2013.01); *G11C 11/417* (2013.01); *G11C 5/143* (2013.01); *H02J 4/00* (2013.01)

(58) Field of Classification Search
CPC .......................... G11C 11/4125; G11C 11/417
See application file for complete search history.

(56) References Cited

U.S. PATENT DOCUMENTS

| 5,734,622 | A | 3/1998 | Furumochi |
| 2008/0175068 | A1* | 7/2008 | Houston .............. G11C 5/143 365/185.27 |

(Continued)

OTHER PUBLICATIONS

The European Patent Office (EPO) The Extended European Search Report for 17200717.1 dated Mar. 28, 2018 7 Pages.

*Primary Examiner* — Ajay Ojha
(74) *Attorney, Agent, or Firm* — Anova Law Group, PLLC

(57) ABSTRACT

Retention voltage generation circuits and electronic apparatus are provided. An exemplary retention voltage generation circuit includes a driving circuit, configured to generate driving currents; a first retention voltage generation circuit, configured to generate a first retention voltage, the first retention voltage being substantially equal to a threshold voltage of an NMOS transistor in a power-consumption circuit; a second retention voltage generation circuit, configured to generate a second retention voltage, the second retention voltage being substantially equal to a threshold voltage of a PMOS transistor in the power-consumption circuit; and a retention voltage selection circuit, coupled to the first retention voltage generation circuit and the second retention voltage generation circuit, and configured to receive the driving currents, wherein retention voltage selection circuit is configured to select a higher voltage from the first retention voltage and the second retention voltage as a retention voltage to drive the power-consumption circuit to operate at a retention mode.

20 Claims, 4 Drawing Sheets

(51) Int. Cl.
 *G05F 3/24* (2006.01)
 *G11C 5/14* (2006.01)
 *H02J 4/00* (2006.01)

(56) References Cited

U.S. PATENT DOCUMENTS

2012/0140585 A1 6/2012 Van et al.
2015/0106671 A1 4/2015 Guo et al.
2017/0346299 A1* 11/2017 Sridhar .................... H02J 4/00

* cited by examiner

RETENTION VOLTAGE GENERATION CIRCUIT AND ELECTRONIC APPARATUS

CROSS-REFERENCES TO RELATED APPLICATIONS

This application claims the priority of Chinese patent application No. 201610994781.X, filed on Nov. 11, 2016, the entirety of which is incorporated herein by reference.

FIELD OF THE DISCLOSURE

The present disclosure generally relates to the field of integrated circuits (ICs) and, more particularly, relates to retention voltage generation circuits and electronic apparatus.

BACKGROUND

With the continuous development of intelligent wearable technologies, more and more wearable apparatus have penetrated into every part of people's daily life. The intelligent wearable apparatus includes intelligent watches, and heath wristbands, etc. For the development of the wearable apparatus, the size and the power consumption are the two key factors to evaluate if a wearable apparatus is able to attract customers' attentions. For the intensively competitive market of the wearable apparatus, weather the wearable apparatus are able to attract the customers' attentions determines the success of the wearable apparatus in the market. Therefore, almost all of the manufacturers of the wearable apparatus focus on the size and the power consumption of the wearable apparatus when the wearable devices are developed.

Considering the size and the power consumption of the wearable apparatus, as one of the important type of components in the wearable devices, static random access memory (SRAM) needs to meet the requirements of high performance, low power-consumption and small size. The current approach to reduce the power consumption of the SRAM is to use a retention mode to reduce the supply voltage of the SRAM. Under such a supply voltage, the memory cells of the SRAM are only able to store data; and such a supply voltage is referred to as a data retention voltage (DRV).

In a low-power SRAM design, the retention mode is often achieved by a double-source voltage structure. When the circuit is in operation, the source voltage is kept as constant, the SRAM operates normally, and the performance of the SRAM is not adversely affected. When the circuit is at a stand-by status, by reducing the source voltage, the sub-threshold leakage current, the gate leakage current and the junction leakage current can be affectively reduced. However, when such a structure is used, the noise margin is easily reduced; and the stability of the data stored in the SRAM is affected. On the other hand, reducing the source voltage requires an external circuit. Thus, the area of the IC chip cannot be further reduced. Further, when the source voltage is switched between two statuses, it requires extra time and extra dynamic power-consumption.

In the most circumstances, it needs to connect the double-source voltage structure in the external regions of the SRAM to generate the retention voltage to reduce the power consumption of the IC chip. However, such a circuit design is unable to effectively reduce the area of the IC chip. On the other hand, when the double-source voltage structure is performing voltage switches, it needs extra time and extra dynamic power consumption; and the SRAM is unable to effectively achieve a low-power consumption operation status.

The disclosed circuits and electronic apparatus are directed to solve one or more problems set forth above and other problems in the art.

BRIEF SUMMARY OF THE DISCLOSURE

One aspect of the present disclosure includes a retention voltage generation circuit. The retention voltage generation circuit includes a driving circuit, configured to generate driving currents; a first retention voltage generation circuit, configured to generate a first retention voltage, the first retention voltage being substantially equal to a threshold voltage of an NMOS transistor in a power-consumption circuit; a second retention voltage generation circuit, configured to generate a second retention voltage, the second retention voltage being substantially equal to a threshold voltage of a PMOS transistor in the power-consumption circuit; and a retention voltage selection circuit, coupled to the first retention voltage generation circuit and the second retention voltage generation circuit, and configured to receive the driving currents, wherein retention voltage selection circuit is configured to select a higher voltage from the first retention voltage and the second retention voltage as a retention voltage to drive the power-consumption circuit to operate at a retention mode.

Another aspect of the present disclosure includes an electronic apparatus. The electronic apparatus includes a retention voltage generation circuit; and a power-consumption circuit coupled to the retention voltage generation circuit. The retention voltage generation circuit includes a driving circuit, configured to generate driving currents; a first retention voltage generation circuit, configured to generate a first retention voltage, the first retention voltage being substantially equal to a threshold voltage of an NMOS transistor in a power-consumption circuit; a second retention voltage generation circuit, configured to generate a second retention voltage, the second retention voltage being substantially equal to a threshold voltage of a PMOS transistor in the power-consumption circuit; and a retention voltage selection circuit, coupled to the first retention voltage generation circuit and the second retention voltage generation circuit, and configured to receive the driving currents, wherein retention voltage selection circuit is configured to select a higher voltage from the first retention voltage and the second retention voltage as a retention voltage to drive the power-consumption circuit to operate at a retention mode.

Other aspects of the present disclosure can be understood by those skilled in the art in light of the description, the claims, and the drawings of the present disclosure.

DETAILED DESCRIPTION

Figure 1:
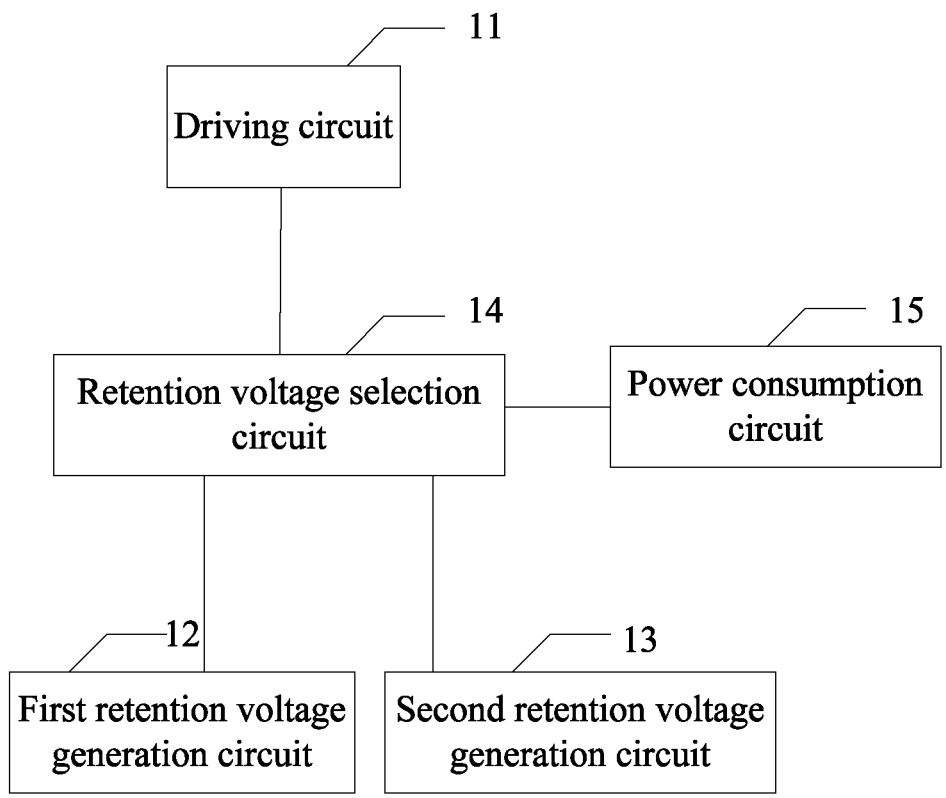
FIG. 1 illustrates an exemplary retention voltage generation circuit consistent with the disclosed embodiments.

Reference will now be made in detail to exemplary embodiments of the disclosure, which are illustrated in the accompanying drawings. Wherever possible, the same reference numbers will be used throughout the drawings to refer to the same or like parts. In the description, "equal" and/or "similar" may not be limited to the strict equivalencies in the values, it may also refer to the equivalencies in an acceptable range.

Wearable electronic apparatus are often confined, due to use of a peripheral region of memory device (e.g., SRAM) to connect to an external double-source voltage structure to generate retention voltage, so as to reduce the power consumption of the electronic apparatus and to achieve a data storage function simultaneously. However, such a circuit design is unable to effectively reduce the area of the chip. On the other hand, when externally connected double-source voltage structure is switching the voltages, it is easy to introduce extra time and dynamic power-consumption. Thus, the SRAM is unable to effectively achieve a low-power consumption operation status.

The present disclosure provides a retention voltage generation circuit and an electronic apparatus. In the present disclosure, the first retention voltage generation circuit may generate a first retention voltage that is substantially equal to the threshold voltage of the NMOS transistor in the power-consumption circuit. The second retention voltage generation circuit may generate a second retention voltage that is substantially equal to the threshold voltage of the PMOS transistor in the power-consumption circuit. Then, the retention voltage selection circuit may select one of the first retention voltage and the second retention voltage that has a higher voltage value as a retention voltage; and apply the retention voltage to drive the power-consumption circuit. Such a retention voltage may ensure the power-consumption circuit to operate normally.

In the disclosed embodiments, the driving circuit may generate driving currents according to the leakage currents of the PMOS transistors to drive the retention voltage selection circuit. Thus, the retention voltage selection circuit may be able to select a higher voltage from the first retention voltage and the second retention voltage as a retention voltage to drive the power-consumption circuit to operate at the retention mode. Because the first retention voltage may be equal to the threshold voltage of the NMOS transistor in the power-consumption circuit; the second retention voltage may be equal to the threshold voltage of the PMOS transistor in the power-consumption circuit, when the retention voltage is the higher one from the first retention voltage and the second retention voltage, the PMOS transistor and the NMOS transistor in the power-consumption circuit may be both turned on. Further, when the power-consumption circuit is SRAM, the retention voltage generated by the disclosed circuits may effectively ensure the normal inversion of the invertor in the SRAM. Thus, under the condition that the SRAM is able to store data, the retention voltage may be minimized; and the dynamic power-consumption of the operation of the electronic apparatus may be effectively reduced.

FIG. 1 illustrates an exemplary retention voltage generation circuit consistent with the disclosed embodiments. The retention voltage may be the supply voltage of a power consumption circuit operating at a retention mode. The retention voltage may be smaller than the supply voltage of the power-consumption circuit when the power consumption circuit is operating at a normal mode. At the retention mode, the supply voltage of the power-consumption circuit is reduced to the a certain value under which the SRAM may only be able to store data. The supply voltage of the power-consumption circuit with the certain value may be referred to as the retention voltage.

In one embodiment, the retention voltage generation circuit may include a driving circuit 11 configured to generate driving currents and a first retention voltage generation circuit 12 configured to generate a first retention voltage. The first retention voltage may be equal to the threshold voltage of an NMOS transistor in the power-consumption circuit 15. The retention voltage generation circuit may also include a second retention voltage generation circuit 13 configured to generate a second retention voltage that is substantially equal to the threshold voltage of a PMOS transistor in the power-consumption circuit 15; and a retention voltage selection circuit 14 configured to receive the driving currents, and generate circuit couplings with the first retention voltage generation circuit 12 and the second retention voltage generation circuit 13. The retention voltage selection circuit 14 may be used to select a higher voltage from the first retention voltage and the second retention voltage as a retention voltage. The retention voltage may be used to drive the power-consumption circuit 15 to operate at the retention mode.

Because the first retention voltage may be substantially equal to the threshold voltage of the NMOS transistor in the power consumption circuit 15; and the second retention voltage may be substantially equal to the threshold voltage of the PMOS transistor in the power-consumption circuit 15, when the retention voltage selection circuit 14 is selecting the higher voltage from the first retention voltage and the second retention voltage, it may be equivalent to that the retention voltage selection circuit 14 is selecting the higher threshold voltage from the threshold voltage of the NMOS transistor in the power-consumption circuit 15 and the threshold voltage of the PMOS transistor in the power-consumption circuit. In some embodiments, such a process may be referred to as sensing the NMOS transistor and the PMOS transistor in the power-consumption circuit 15.

The power-consumption circuit 15 may be any appropriate electronic circuit. In one embodiment, the power-consumption circuit 15 is a SRAM. The SRAM may achieve the data storage function according to the invertor formed by the PMOS transistor and the NMOS transistor. The NMOS transistor and the PMOS transistor may be devices of the bit-cells of the SRAM. The description of the detailed structures of the SRAM is omitted. In some embodiments, the power-consumption circuit may be other electronic circuit that is formed by the PMOS transistor and the NMOS transistor, and supports the retention mode.

The driving circuit 11 may be configured to generate driving currents. In one embodiment, the first retention voltage generation circuit 12 may be driven by a driving current to generate a first retention voltage; and the second retention voltage generation circuit 13 may be driven by a driving current to generate a second retention voltage. The retention voltage selection circuit 14 may compare the first retention voltage and the second retention voltage; and select the higher voltage from the first retention voltage and the second retention voltage as the retention voltage.

In one embodiment, during the design of the retention voltage generation circuit, the first retention voltage may be designed to be substantially equal to the threshold voltage of the NMOS transistor in the SRAM; and the second retention voltage may be designed to be substantially equal to the threshold voltage of the PMOS transistor in the SRAM.

When the retention voltage is the higher one selected from the first retention voltage and the second retention voltage, it may ensure the PMOS transistor and the NMOS transistor to both operate at a normal status; and the SRAM may be able to operate normally. For example, the invertor in the SRAM may be able to invert normally; and the data storage function of the SRAM may be maintained.

Thus, in such a disclosed retention voltage generation circuit, the retention voltage may be generated by an autonomous selection using the retention voltage selection circuit 14. Comparing the existing methods that utilize the double-source voltage structure to obtain the retention voltage, the power-consumption circuit 15 may be able to obtain the retention voltage to execute the retention mode by a single-source voltage structure, and no extra auxiliary circuit that is used to achieve the source voltage switching is needed. Thus, the circuit structure may be simplified; and it may aid to reduce the area of the chip.

Figure 2:
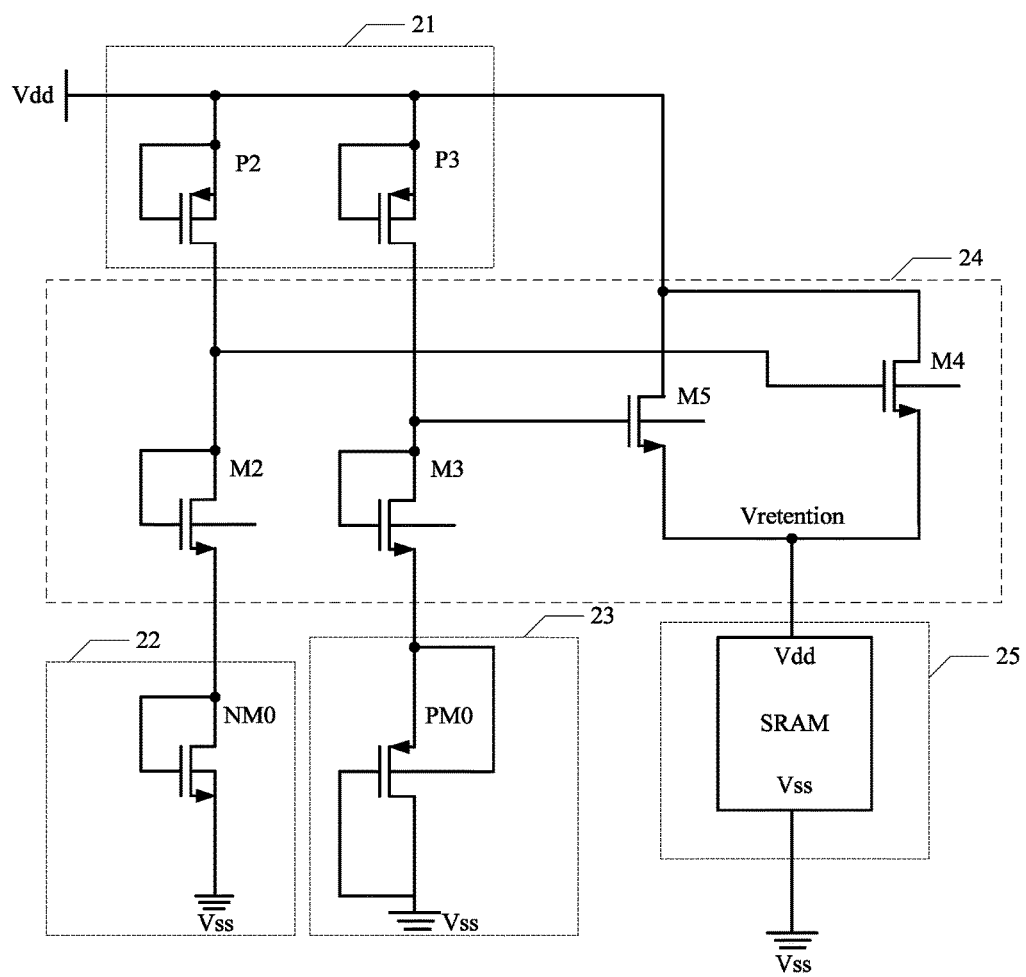
FIG. 2 illustrates another exemplary retention voltage generation circuit consistent with the disclosed embodiments.

FIG. 2 illustrates another exemplary retention voltage generation circuit consistent with the disclosed embodiments. As shown in FIG. 2, the retention voltage generation circuit may include a driving circuit 21, a first retention voltage generation circuit 22, a second retention voltage generation circuit 23, and a retention voltage selection circuit 24. The retention voltage generated by such a circuit may be used to drive a power-consumption circuit 25 to operate at the retention mode.

Specifically, the first retention voltage generation circuit 22 may include a first NMOS transistor NM0. The second retention voltage generation circuit 23 may include a first PMOS transistor PM0. The retention voltage selection circuit 24 may include a second NMOS transistor M2, a third NMOS transistor M3, a fourth NMOS transistor M4, and a fifth NMOS transistor M5. The driving circuit 21 may include a second PMOS transistor P2 and a third PMOS transistor P3.

Further, referring to FIG. 2, the gate and the source of the second PMOS transistor P2 in the driving circuit 21 may be connected together, and may be coupled to a power source $V_{dd}$. The drain of the second PMOS transistor P2 may be coupled to the retention voltage selection circuit 24. The gate and the source of the third PMOS transistor P3 in the driving circuit 21 may be connected together and may be coupled to the power source $V_{dd}$. The drain of the third PMOS transistor P3 may be coupled to the retention voltage selection circuit 24.

In one embodiment, the gate of the second PMOS transistor P2 and the gate of the third PMOS transistor P3 may all be connected to the power source $V_{dd}$. Thus, the second PMOS transistor P2 and the third PMOS transistor P3 may always be at an "off" status; and a leakage may be continuously generated for each of the PMOS transistors. The leakage currents may be used as the driving currents of the disclosed retention voltage generation circuit.

Further, as shown in FIG. 2, the drain and the gate of the first NMOS transistor NM0 in the first retention voltage generation circuit 22 may be connected together, and may be coupled to the retention voltage selection circuit 24. The source of the first NMOS transistor NM0 may be connected to ground. The structure of the first NMOS transistor NM0 may be substantially identical to the structure of an NMOS transistor (not shown) in the power-consumption circuit 25. Specifically, that the structure of the first NMOS transistor NM0 may be substantially identical to the structure of the NMOS transistor in the power-consumption circuit 25 may include the microstructures of the first NMOS transistor NM0 and the NMOS transistor in the power-consumption circuit 25 are substantially identical; and may also include the sizes and parameters of the first NMOS transistor NM0 and the NMOS transistor in the power-consumption circuit 25 are substantially identical. In one embodiment, the model of the first NMOS transistor NM0 may be determined according to the model of the NMOS transistor in the power-consumption circuit 25 so as to ensure the structure of the first NMOS transistor NM0 to be substantially identical to the structure of the NMOS transistor in the power-consumption circuit 25.

Further, as shown in FIG. 2, the drain and the gate of the first PMOS transistor PM0 in the second retention voltage generation circuit 23 may be connected together; and may be connected to ground. The source of the first PMOS transistor PM0 may be coupled to the retention voltage selection circuit 24. The structure of the first PMOS transistor PM0 may be substantially identical to the structure of a PMOS transistor (not shown) in the power-consumption circuit 25. Specifically, that the structure of the first PMOS transistor PM0 may be substantially identical to the structure of the PMOS transistor in the power-consumption circuit 25 may include the microstructures of the first PMOS transistor PM0 and the PMOS transistor in the power-consumption circuit 25 are substantially identical; and may also include the sizes and parameters of the first PMOS transistor PM0 and the PMOS transistor in the power-consumption circuit 25 are substantially identical. In one embodiment, the model of the first PMOS transistor PM0 may be determined according to the model of the PMOS transistor in the power-consumption circuit 25 so as to ensure the structure of the first PMOS transistor PM0 to be substantially identical to the structure of the PMOS transistor in the power-consumption circuit 25.

Further, as shown in FIG. 2, the source of the second NMOS transistor M2 in the retention voltage selection circuit 24 may be coupled to the first voltage generation circuit 22. The gate and the drain of the second NMOS transistor M2 may be connected together and may be used to receive a driving current.

The source of the third NMOS transistor M3 in the retention voltage selection circuit 24 may be coupled to the second retention voltage generation circuit 23. The gate and the drain of the third NMOS transistor M3 may be connected together; and may be used to receive a driving current.

The source of the fourth NMOS transistor M4 and the source of the fifth NMOS transistor M5 in the retention voltage selection circuit 24 may be coupled together to output a retention voltage. The gate of the fifth NMOS transistor M5 and the drain of the third NMOS transistor M3 may be connected together. The drain of the fourth NMOS transistor M4 and the drain of the fifth NMOS transistor M5 may be coupled to the source voltage $V_{ad}$.

In one embodiment, the second NMOS transistor M2, the third NMOS transistor M3 and the fourth NMOS transistor M4 may have a same threshold voltage.

In one embodiment, the gate of the first NMOS transistor NM0 may be coupled to the source of the second NMOS transistor M2.

In one embodiment, the source of the first PMOS transistor PM0 may be coupled to the source of the third NMOS transistor M3.

In one embodiment, the power consumption-circuit 15 may be a SRAM. The NMOS transistor and the PMOS transistor may be the devices of the bit-cell of the SRAM For a typical application, the second NMOS transistor M2 may be connected using the circuit connection method illustrated in FIG. 2. Thus, $V_{GM2}=V_{DM2}=VTN+V_{thM2}$. Where $V_{GM2}$ refers to as the gate voltage of the second NMOS transistor M2. $V_{DM2}$ refers to as the drain voltage of the second NMOS transistor M2. VTN refers to as the first retention voltage generated by the first NMOS transistor NM0. $V_{thM2}$ refers to as the threshold voltage of the second NMOS transistor M2.

Similarly, the third NMOS transistor M3 may be connected using the circuit connection method illustrated in FIG. 2. Thus, $V_{GM3}=V_{DM3}=VTN+V_{thM3}$. Where $V_{GM3}$ refers to as the gate voltage of the third NMOS transistor M3. $V_{DM3}$ refers to as the drain voltage of the third NMOS transistor M3. VTN refers to as the second retention voltage generated by the first PMOS transistor PM0. $V_{thM3}$ refers to as the threshold voltage of the third NMOS transistor M3.

Because the gate of the fourth NMOS transistor M4 may be coupled with the gate of the second NMOS transistor M2, $V_{GM2}=V_{GM4}$. Where $V_{GM4}$ refers to as the gate voltage of the fourth NMOS transistor M4.

Similarly, because the gate of the fifth NMOS transistor M5 may be coupled with the gate of the third NMOS transistor M3, $V_{GM3}=V_{GM5}$. Where $V_{GM5}$ refers to as the gate voltage of the fifth NMOS transistor M5.

When the fifth NMOS transistor M5 is turned on, $V_{SM5}=V_{GM3}-V_{thM5}=VTP+V_{thM3}-V_{thM5}$. Where $V_{SM5}$ of the source voltage of the fifth NMOS transistor M5; and $V_{thM5}$ refers to as the threshold voltage of the fifth NMOS transistor M5.

When the fourth NMOS transistor M4 is turned on, $V_{SM4}=V_{GM2}-V_{thM4}=VTP+V_{thM2}-V_{thM4}$. Where $V_{SM4}$ refers to as the source voltage of the fourth NMOS transistor M4; and $V_{thM4}$ refers to as the threshold voltage of the fourth NMOS transistor M4.

Because $V_{thM2}=V_{thM3}=V_{thM4}=V_{thM5}$, when the fifth NMOS transistor M5 is turned on, $V_{SM5}=VTP$. When the fourth NMOS transistor M4 is turned on, $V_{SM4}=VTN$. In one embodiment, according to the "on/off" status of the fourth NMOS transistor M4 and the fifth NMOS transistor M5, the retention voltage selection circuit 24 may select the higher one from $V_{SM4}$ and $V_{SM5}$ as the retention voltage.

In one embodiment, the leakage currents of the PMOS transistors in the driving circuit 21 are used as the driving currents of the retention voltage generation circuit. In some embodiments, the driving circuit 21 may also be coupled to the power source to generate the driving currents.

Further, the leakage currents generated by the second PMOS transistor P2 and the third PMOS transistor P3 may be equal to, or greater than the leakage currents of the second NMOS transistor M2 and the third NMOS transistor M3. Such a condition may ensure the drain voltage of the first NMOS transistor NM0 and the source voltage of the first PMOS transistor PM0 may not be pulled down to a significantly low value. Thus, the retention voltage selection circuit 24 may be able to precisely obtain the first retention voltage generated by the first retention voltage generation circuit 22 and the second retention voltage generated by the second retention voltage generation circuit 23. That is, the retention voltage selection circuit 24 may be able to sense the threshold voltage of the NMOS transistor in the power-consumption circuit 25 and the PMOS transistor in the power-consumption circuit 25 because the first retention voltage may be substantially equal to the threshold voltage of the NMOS transistor in the power-consumption circuit 25 and the second retention voltage may be substantially equal to the threshold voltage of the PMOS transistor in the power-consumption circuit 25.

Further, the second NMOS transistor M2 and the third NMOS transistor M3 may be connected by a diode. The fifth NMOS transistor M5 and the fourth NMOS transistor M4 may have a mirror connection.

In one embodiment, the value of the first retention voltage may be equal to the value of the second retention voltage. Thus, the fifth NMOS transistor M5 and the fourth NMOS transistor M4 may be turned on simultaneously. The retention voltage selection circuit 24 may be able to select one of the first retention voltage and the second retention voltage as a retention voltage to drive the power-consumption circuit 25 to operate at the retention mode.

In some embodiments, the second PMOS transistor P2 and the third PMOS transistor P3 may be substituted by low currents. For example, the low currents generated from the electronic apparatus and other circuits may be used to drive the retention voltage generation circuit. In one embodiment, the low currents may be in a range of approximately 10 nA. In some embodiments, the driving currents may be generated by other appropriate methods and circuits.

In one embodiment, during the design of the first retention generation circuit 12, the first NMOS transistor NM0 may be designed to have a structure substantially identical to the structure of the NMOS transistor in the power-consumption circuit 25 such that when the circuit illustrated in FIG. 2 is in operation, the drain voltage of the NMOS transistor in the power-consumption circuit may be equal to the threshold voltage of the first NMOS transistor NM0. Further, because the structure of the first NMOS transistor NM0 may be substantially identical to the structure of the NMOS transistor in the power-consumption circuit 25, the threshold voltage of the first NMOS transistor NM0 and the threshold voltage of the NMOS transistor in the power-consumption circuit 25 may also be substantially equal.

Similarly, when the first PMOS transistor PM0 in the circuit illustrated in FIG. 2 is connected to be turned on, the source voltage of the PMOS transistor in the power-consumption mode may be substantially equal to the threshold voltage of the first PMOS transistor PM0. Further, because the structure of the first PMOS transistor PM0 may be substantially identical to the structure of the PMOS transistor in the power-consumption circuit 25, the threshold voltage of the first PMOS transistor PM0 and the threshold voltage of the PMOS transistor in the power-consumption circuit 25 may also be equal.

Further, when the retention voltage selection circuit 24 selects one of the higher voltage from the first retention voltage generated by the first NMOS transistor NM0 and the second retention voltage generated by the first PMOS transistor PM0 as the retention voltage, because the retention voltage may be at least substantially equal to the higher voltage selected from the threshold voltage of the PMOS transistor in the power-consumption circuit 25 and the threshold voltage of the NMOS transistor in the power-consumption circuit 25, it may ensure the PMOS transistor in the power-consumption circuit 25 and the NMOS transistor in the power-consumption circuit 25 to be both turned on. Accordingly, the power-consumption circuit 25 may be able to operate normally.

Thus, for the retention voltage generation circuit illustrated in FIG. 2, the retention voltage selection circuit 24 may be able to generate the retention voltage by an autonomous selection according to the "on/off" status of the fourth NMOS transistor M4 and the fifth NMOS transistor M5. Thus, under the condition that the invertor in the SRAM may be able to invert normally, the retention voltage may be kept as low as possible to reduce the power consumption of the retention voltage generation circuit.

Optionally and additionally, in some embodiments, a sixth NMOS transistor M6 (not shown) may be included in the retention voltage generation circuits illustrated in FIG. 1 and FIG. 2. The gate of the sixth NMOS transistor M6 may be connected to an external power source circuit; and the source of the sixth NMOS transistor M6 may be coupled to the power-consumption circuit.

The power source circuit may provide a normal operating voltage to the power-consumption circuit. The normal operating voltage may be greater than the first retention voltage and the second retention voltage. For example, the first retention voltage may be approximately 0.5 V; the second retention voltage may be approximately 0.3 V; and the normal operating voltage may be up to approximately 0.9 V.

Thus, in the retention voltage generation circuit having the sixth NMOS transistor M6, the retention voltage selection circuit 24 may be able to select the highest voltage from the source voltages of the fourth NMOS transistor M4, the fifth NMOS transistor M5 and the sixth NMOS transistor M6 as the retention voltage. When there is a normal operating voltage, because the normal operating voltage may be significantly greater than the threshold voltages of all the MOS transistors in the power-consumption circuit 25, the retention voltage selection circuit 24 may preferably select the normal operating voltage as the retention voltage so as to ensure the power-consumption circuit 25 to operate normally. However, because the normal operating voltage may be relatively large, it may not match the design requirements of high performance, low power-consumption and small size of the retention voltage generation circuit.

Thus, in one embodiment, when an electronic apparatus is connected with an external power source (for example, the electronic apparatus is plugged in for charging), the normal operating voltage may be provided as the retention voltage of the SRAM using the sixth NMOS transistor M6. When the electronic apparatus needs to use an internal portable battery to provide a low current to function, the power source circuit may be turned off. The retention voltage selection circuit 24 may preferably select the higher voltage from the source voltage of the fourth NMOS transistor M4 and the source voltage of the fifth NMOS transistor M5 as the retention voltage of the SRAM. Under the condition that the invertor in the SRAM may be able to invert normally to store data, the retention voltage may be kept as low as possible; and the power-consumption of the SRAM may be reduced.

The power source circuit may be any appropriate device. In one embodiment, the power source circuit is a power source switching tube.

Figure 4:
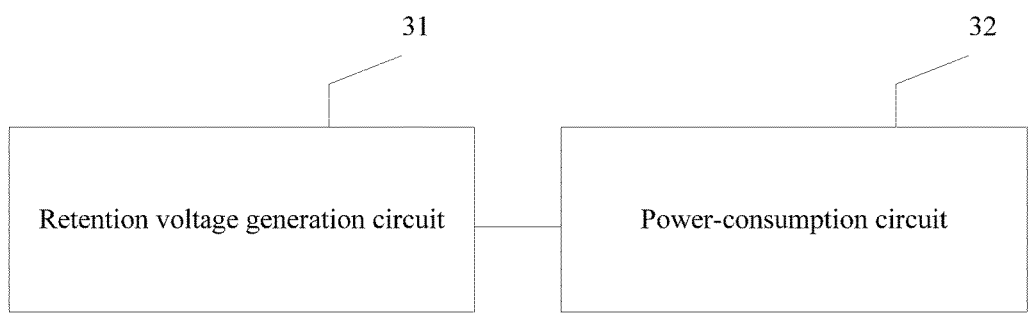
FIG. 4 illustrates an exemplary electronic apparatus consistent with the disclosed embodiments.

The present disclosure also provides an electronic apparatus. FIG. 4 illustrates an exemplary electronic apparatus.

As shown in FIG. 4, the electronic apparatus may include a retention voltage generation circuit 31 and a power-consumption circuit 32 coupled to the retention voltage generation circuit 31. The retention voltage generation circuit 31 may include the disclosed retention voltage generation circuits illustrated in FIG. 1 and FIG. 2, or other appropriate retention voltage generation circuit.

Figure 3:
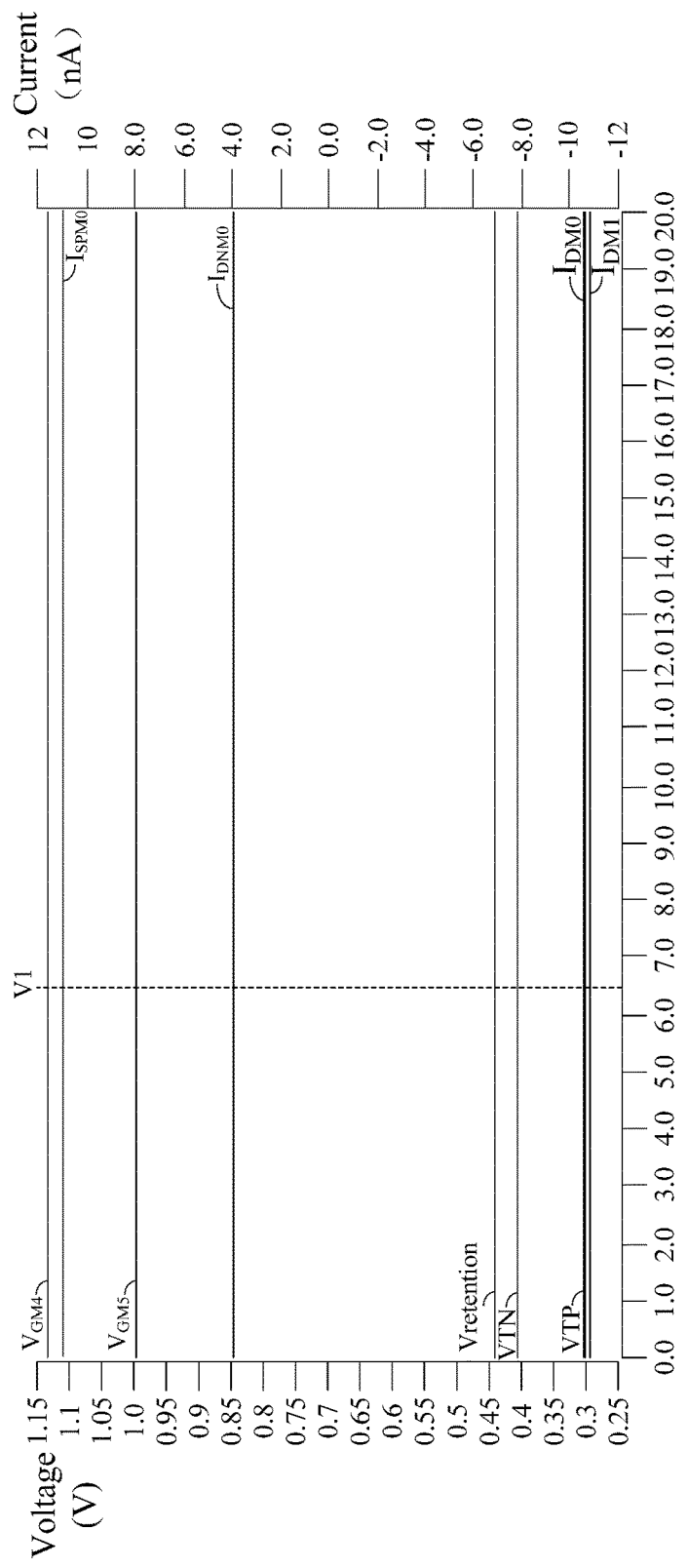
FIG. 3 illustrates a simulation result of an exemplary electronic apparatus consistent with the disclosed embodiments.

For illustrative purposes, the electronic apparatus may run the disclosed retention voltage generation circuit illustrated in FIG. 2. FIG. 3 illustrates simulation results of the electronic apparatus running the voltage generation circuit illustrated in FIG. 2.

As shown in FIGS. 2-3, the driving circuit 21 may include the second PMOS transistor P2, the absolute value of the leakage current ($I_{DM0}$) generated by the second PMOS transistor P2 may be approximately 10.45 nA. The first retention voltage (VTN) generated by the first retention voltage generation circuit 22 according to the leakage current $I_{DM0}$ may be approximately 416.496 mV.

Further, the driving circuit 21 may also include the third PMOS transistor P3. The absolute value of the leakage current ($I_{DM1}$) generated by the third PMOS transistor P3 may be approximately 10.93 nA. The second retention voltage (VTP) generated by the second retention voltage generation circuit 23 according to the leakage current $I_{DM1}$ may be approximately 306.674 mV.

Further, the retention voltage selection circuit 24 may also include the second NMOS transistor M2, the third NMOS transistor M3, the fourth NMOS transistor M4 and the fifth NMOS transistor M5. Under the driving currents, the actually gate voltage of the fourth NMOS transistor M4 ($V_{GM4}$) measured by the retention voltage selection circuit 24 may be approximately 1.13842 V; the actually measured gate voltage of the fifth NMOS transistor M6 ($V_{GM5}$) may be approximately 993.767 mV. Thus, the fourth NMOS transistor M4 may be turned on; and the fifth NMOS transistor M5 may be turned off. The actually measured retention voltage ($V_{retention}$) obtained by the retention voltage selection circuit 24 may be approximately 439.653 mV. Because the second NMOS transistor M2, the third NMOS transistor M3, the fourth NMOS transistor M4 and the fifth NMOS transistor M5 may have a same threshold voltage, considering some factors, such as transmission lost, etc., in the real applications of the retention voltage generation circuit, the higher voltage from the first retention voltage (VTN) and the second retention voltage (VTP) may be selected as the retention voltage. That is, the first retention voltage (VTN) may be selected as the retention voltage.

Further, as shown in the FIG. 3, the measured value of the drain current ($I_{DNM0}$) of the first NMOS transistor NM0 in the first retention voltage generation circuit 22 may be approximately 3.9782 nA; and may be smaller than the absolute value of the leakage current $I_{DM0}$ generated by the second PMOS transistor P2. The source current ($I_{SPM0}$) of the first PMOS transistor PM0 in the second retention voltage generation circuit 23 may be approximately of 10.91 nA; and may be smaller than the absolute value of the leakage current $I_{DM1}$ generated by the second PMOS transistor P2. Thus, the design requirement that the leakage currents of the second PMOS transistor P2 and the third PMOS transistor P3 may be equal to, or greater than the leakage currents of the second NMOS transistor M2 and the third NMOS transistor M3 may be matched. Accordingly, it may ensure that the node of the first retention voltage VTN and the node of the second retention voltage VTP may not be pull down to a relatively small value.

Thus, comparing with the existing techniques, the disclosed retention voltage generation circuit and the electronic apparatus may include following advantages.

For example, according to the first retention voltage generated by a first retention voltage generation circuit and being equal to the threshold voltage of the NMOS transistor in the power-consumption circuit, and the second retention voltage generated by a second retention voltage generation circuit and being substantially equal to the threshold voltage of the PMOS transistor in the power-consumption circuit, the retention voltage selection circuit may select the higher voltage from the first retention voltage and the second retention voltage as the retention voltage to drive the power-consumption circuit to operate at the retention mode. The power-consumption circuit may be able to operate normally. Compared with the retention voltage generation method with the double-source voltage structure, the circuit structures of the disclosed retention voltage generation circuits may be simpler; and the external circuits required by the source voltage switching may be omitted. Thus, the size of the electronic apparatus may be further reduced.

Further, by the autonomous selection of the retention voltage, the extra time and dynamic power-consumption caused by the switching between two voltage statuses may be avoided. At the same time, because the generated retention voltage may be approximately the maximum value of the threshold voltages of the MOS transistors in the power-consumption circuit, under the condition that the power-consumption circuit is able to operate normally, the retention voltage may be minimized; and the dynamic power-consumption of the electronic apparatus may be reduced when the electronic apparatus is in operation.

Further, the driving circuit of the disclosed retention voltage generation circuit may include two PMOS transistors. The PMOS transistors may generate driving currents by connecting the gates with the sources and being coupled to the power source. Because the driving currents may be substantially equal to the leakage currents of the PMOS transistors, the electronic apparatus may operate normally using a low current provided by a portable battery. The design requirements of small size, long stand-by time and low power-consumption for the electronic apparatus may be matched.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A retention voltage generation circuit, comprising:
    a driving circuit, configured to generate driving currents;
    a first retention voltage generation circuit, configured to generate a first retention voltage, the first retention voltage being substantially equal to a threshold voltage of an NMOS transistor in a power-consumption circuit;
    a second retention voltage generation circuit, configured to generate a second retention voltage, the second retention voltage being substantially equal to a threshold voltage of a PMOS transistor in the power-consumption circuit; and
    a retention voltage selection circuit, coupled to the first retention voltage generation circuit and the second retention voltage generation circuit, and configured to receive the driving currents, wherein retention voltage selection circuit is configured to compare the threshold voltage of the NMOS transistor and the PMOS transistor in the power-consumption circuit, and select a higher voltage from the first retention voltage and the second retention voltage as a retention voltage to drive the power-consumption circuit to operate at a retention mode.

2. The retention voltage generation circuit according to claim 1, wherein:
    the driving currents are leakage currents generated from the driving circuit.

3. The retention voltage generation circuit according to claim 1,
    wherein the first retention voltage generation circuit comprises:
    a first NMOS transistor,
    wherein:
        a drain and a gate of the first NMOS transistor are connected together, and coupled to the retention voltage selection circuit; and
        a source of the first NMOS transistor is connected to ground.

4. The retention voltage generation circuit according to claim 2, wherein:
    a structure of the first NMOS transistor and a structure of an NMOS transistor in the power-consumption circuit are substantially identical.

5. The retention voltage generation circuit according to claim 1,
    wherein the second retention voltage generation circuit comprises:
    a first PMOS transistor,
    wherein:
        a drain and a gate of the first PMOS transistor are connected together, and connected to ground; and
        a source of the first NMOS transistor is coupled to the retention voltage selection circuit.

6. The retention voltage generation circuit according to claim 5, wherein:
    a structure of the first POMS transistor and a structure of a PMOS transistor in the power-consumption circuit are substantially identical.

7. The retention voltage generation circuit according to claim 1, wherein the retention voltage selection circuit comprises:
    a second NMOS transistor, having a source coupled to the first retention voltage generation circuit, and having a gate and a drain connected together to receive one of the driving currents;
    a third NMOS transistor, having a source coupled to the second retention voltage generation circuit, and having a gate and a drain connected together to receive another of the driving currents; and
    a fourth NMOS transistor and a fifth NMOS transistor, wherein:
        a source of the fourth NMOS transistor and a source of the fifth NMOS transistor are coupled to output the retention voltage;
        a gate of the fourth NMOS transistor is connected to the drain of the second NMOS transistor;
        a gate of the fifth NMOS transistor is connected to the drain of the third NMOS transistor; and
        a drain of the fourth NMOS transistor and a drain of the fifth NMOS transistor are coupled to a power source.

8. The retention voltage generation circuit according to claim 7, wherein:
    the second NMOS transistor, the third NMOS transistor, the fourth NMOS transistor and the fifth NMOS transistor have a same threshold voltage.

9. A retention voltage generation circuit, comprising:
    a driving circuit, configured to generate driving currents, wherein the driving circuit comprises:
        a second PMOS transistor, having a gate and a source connected and coupled to a power source, and a drain coupled to the retention voltage selection circuit; and
        a third PMOS transistor, having a gate and a source connected and coupled to the power source, and a drain coupled to the retention voltage selection circuit;
    a first retention voltage generation circuit, configured to generate a first retention voltage, the first retention voltage being substantially equal to a threshold voltage of an NMOS transistor in a power-consumption circuit;

a second retention voltage generation circuit, configured to generate a second retention voltage, the second retention voltage being substantially equal to a threshold voltage of a PMOS transistor in the power-consumption circuit; and a retention voltage selection circuit, coupled to the first retention voltage generation circuit and the second retention voltage generation circuit, and configured to receive the driving currents, wherein retention voltage selection circuit is configured to select a higher voltage from the first retention voltage and the second retention voltage as a retention voltage to drive the power-consumption circuit to operate at a retention mode.

10. The retention voltage generation circuit according to claim 9, wherein:
a leakage current of the second PMOS transistor and a leakage current of the third PMOS transistor are equal to, or greater than a leakage current of the second NMOS transistor and a leakage current of the third NMOS transistor.

11. The retention voltage generation circuit according to claim 1, wherein:
the power-consumption circuit is a static random access memory (SRAM).

12. An electronic apparatus, comprising:
a retention voltage generation circuit; and
a power-consumption circuit coupled to the retention voltage generation circuit, wherein the retention voltage generation circuit includes:
a driving circuit, configured to generate driving currents;
a first retention voltage generation circuit, configured to generate a first retention voltage, the first retention voltage being substantially equal to a threshold voltage of an NMOS transistor in a power-consumption circuit;
a second retention voltage generation circuit, configured to generate a second retention voltage, the second retention voltage being substantially equal to a threshold voltage of a PMOS transistor in the power-consumption circuit; and
a retention voltage selection circuit, coupled to the first retention voltage generation circuit and the second retention voltage generation circuit, and configured to receive the driving currents, wherein retention voltage selection circuit is configured to compare the threshold voltage of the NMOS transistor and the PMOS transistor in the power-consumption circuit, and select a higher voltage from the first retention voltage and the second retention voltage as a retention voltage to drive the power-consumption circuit to operate at a retention mode.

13. The retention voltage generation circuit according to claim 12, wherein:
the driving currents are leakage currents generated from the driving circuit.

14. The electronic apparatus according to claim 12, wherein the first retention voltage generation circuit comprises:
a first NMOS transistor,
wherein:
a drain and a gate of the first NMOS transistor are connected together, and coupled to the retention voltage selection circuit; and
a source of the first NMOS transistor is connected to ground.

15. The electronic apparatus according to claim 12, wherein:
a structure of the first NMOS transistor and a structure of an NMOS transistor in the power-consumption circuit are substantially identical.

16. The electronic apparatus according to claim 12, wherein the second retention voltage generation circuit comprises:
a first PMOS transistor,
wherein:
a drain and a gate of the first PMOS transistor are connected together, and connected to ground; and
a source of the first NMOS transistor is coupled to the retention voltage selection circuit.

17. The electronic apparatus according to claim 16, wherein the retention voltage selection circuit comprises:
a structure of the first POMS transistor and a structure of a PMOS transistor in the power-consumption circuit are substantially identical.

18. The electronic apparatus according to claim 12, wherein the retention voltage selection circuit comprises:
a second NMOS transistor, having a source coupled to the first retention voltage generation circuit, and having a gate and a drain connected together to receive one of the driving currents;
a third NMOS transistor, having a source coupled to the second retention voltage generation circuit, and having a gate and a drain connected together to receive another of the driving currents; and
a fourth NMOS transistor and a fifth NMOS transistor, wherein:
a source of the fourth NMOS transistor and a source of the fifth NMOS transistor are coupled to output the retention voltage;
a gate of the fourth NMOS transistor is connected to the drain of the second NMOS transistor;
a gate of the fifth NMOS transistor is connected to the drain of the third NMOS transistor; and
a drain of the fourth NMOS transistor and a drain of the fifth NMOS transistor are coupled to a power source.

19. The electronic apparatus according to claim 12, wherein the driving circuit comprises:
a second PMOS transistor, having a gate and a source connected together and coupled to a power source, a drain coupled to the retention voltage selection circuit; and
a third PMOS transistor, having a gate and a source of connected together and coupled to the power source, and a drain coupled to the retention voltage selection circuit.

20. The retention voltage generation circuit according to claim 19, wherein:
a leakage current of the second PMOS transistor and a leakage current of the third PMOS transistor are substantially equal to, or greater than a leakage current of the second NMOS transistor and a leakage current of the third NMOS transistor.

* * * * *